United States Patent [19]

Lievens et al.

[11] Patent Number: 4,811,583
[45] Date of Patent: Mar. 14, 1989

[54] FEED-THROUGH ELEMENTS THEREFOR

[75] Inventors: Hugo Lievens, Gent; Wilfried Coppens, Kortrijk-Marke, both of Belgium

[73] Assignee: N.V. Bekaert S.A., Zwevegem, Belgium

[21] Appl. No.: 106,367

[22] Filed: Oct. 9, 1987

[30] Foreign Application Priority Data

Oct. 23, 1986 [NL] Netherlands ............... 86/02661

[51] Int. Cl.$^4$ ............... B21F 21/00; B21D 37/16; C21D 9/54; C23C 14/00
[52] U.S. Cl. ............... 72/38; 118/733
[58] Field of Search ............... 34/242; 72/38, 41, 274, 72/467, 468, 46; 118/50, 733; 29/DIG. 44

[56] References Cited

U.S. PATENT DOCUMENTS

| | | | |
|---|---|---|---|
| 2,972,330 | 2/1961 | Bugbee | 118/49 |
| 2,996,410 | 8/1961 | Hnilicka, Jr. | 117/107 |
| 3,879,973 | 4/1975 | Godyn et al. | 72/41 X |
| 4,096,823 | 6/1978 | Schladitz | 118/48 |

FOREIGN PATENT DOCUMENTS 2243378 4/1975 France .
1428993 3/1976 United Kingdom .

Primary Examiner—E. Michael Combs
Attorney, Agent, or Firm—Foley & Lardner, Schwartz, Jeffery, Schwaab, Mack, Blumenthal & Evans

[57] ABSTRACT

The invention relates to a feed-through element for application in a vacuum apparatus for the continuous feeding through of material with wire character to be treated at least comprising a tubular casing with an inside diameter that is larger than the outside diameter of the material to be fed through, whereby the free surface which is left between the material to be fed through and the inner side of the tubular casing (21) does not exceed 30% of the total surface availabe inside the tubular casing (21), and whereby the value of the quotient of L/S-free being more than or equal to 500 mm$^{-1}$, where L represents the length of the tubular casing (21) in mm and S-free the free surface in mm$^2$.

5 Claims, 1 Drawing Sheet

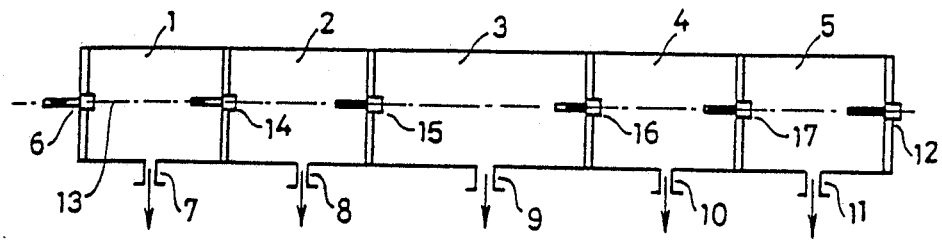
*Fig. 1.*
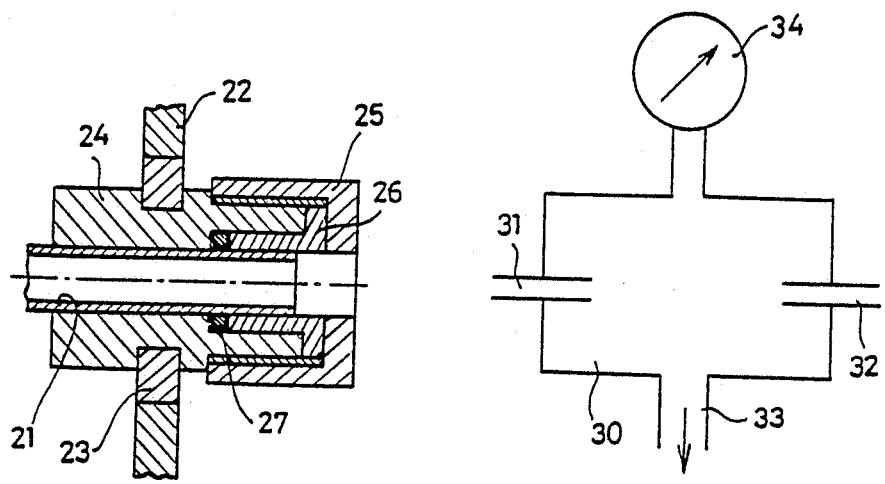
*Fig. 2.*  *Fig. 3.*

FEED-THROUGH ELEMENTS THEREFOR

BACKGROUND OF THE INVENTION

The invention relates in the first place to a feed-through element for application in a vacuum apparatus for the continuous feeding through of material with wire character to be treated at least comprising a tubular casing with an inside diameter that is larger than the outside diameter of the material to be fed through.

Such feed-through element is known from British Patent Specification No. 1,428,933. In said publication is described a tubular feed-through element, which can be inserted in the external wall of a vacuum treatment apparatus or in the partition walls located between the different compartments of such apparatus. Said tubular feed-through elements consist of a casing and also of bored end flanges through which the wire-shaped product to be treated can be fed. Inside the casing there are bored sealing elements of material with a low friction coefficient and/or a good heat resistance the bore being such that the outer surface of the wire-shaped product to be treated fits closely to the inner surface of the bore.

The term of "vacuum treatment" is in the present application to be understood as referring to every treatment of material with wire character that takes place in a vacuum environment, such as vacuum deposition, sputtering, plasma precipitation, ion implantation, heat treatments, plasma cleaning etc.

"Products with a wire character" is to be understood as referring to both single wires and composite wires such as cords or ropes.

A known feed-through element as described hereinabove has the disadvantage that the elements which fit closely to the wire-shaped products thereby forming a seal are subject to very high wear, so that the sealing effectiveness decreases with time. Furthermore, such sealing elements may occasion wire rupture, which results in a complete standstill of the apparatus involving large-scale operations to restart the installation. In the third place, the contact between the sealing elements and the wire surface may cause extra contamination of the surface, which is of course undesirable. Furthermore, such feed-through elements are only suited for application with one and the same wire type; a transition to a wire type with a different thickness requires changing the sealing elements.

SUMMARY OF THE INVENTION

It is an object of the present invention to provide a more universal feed-through element than can be used for several thicknesses of wire; that does not occasion contamination of the surface of the material with wire character and whereby the risk of wire rupture is considerably reduced.

Said objects are achieved with the feed-through element according to the invention, this being characterised in that the free surface which is left between the material to be fed through and the inner side of the tubular casing does not exceed 30% of the total surface available inside the tubular casing, whereby the value of the quotient of L/S-free being more than or equal to 500 $mm^{-1}$, where L represents the length of the tubular casing in mm. and S-free the free surface in $mm^2$.

Surprisingly, it has been found that by dispensing with the above elements sealing on a wire-shaped product, an effective resistance to gas flow is still attained when the remaining free surface between the wire-shaped material to be fed through and the inner side of the tubular casing does not exceed 30%, the length of the tubular casing to be applied bearing a proportion to the remaining free surface in accordance with the specified relation.

As will appear from the examples, the vacuum to be attained presents an asymptotic course if the length of the tubular casing applied is increased with a fixed free surface. In other words: with a free surface fixed in advance in increasing length of the casing applied, the vacuum to be attained will no longer show any improvement from a certain minimum length onwards.

It is clear that such an arrangement requires the application of a pump with an adequate capacity.

An additional advantage of the feed-through element according to the invention is that the feeding through of wire-shaped materials becomes very simple indeed. With switched-on pump or pumps, there will be an air flow through the tubular casing directed from outside the apparatus inwards. When introducing a wire-shaped material through such a feed-through element, the wire is sucked inwards as it were; guiding elements inside the apparatus provide a correct positioning of the material with respect to any other feed-through elements present.

In particular, the free surface in the feed-through element according to the invention is less than 15%, the length of the tubular casing at least being 200 mm with a quotient of L/S-free of 1000 $mm^{-1}$.

Advantageously, the feed-through element according to the invention is fixed in a partition wall so that it can be detached; such a partition wall may be a wall that separates the apparatus from the environment or a wall that separates different chambers of an apparatus. This detachable arrangement of the feed-through element according to the invention allows a rapid exchange of the feed-through elements so that when changing to a wire type requiring another feed-through element, such exchange can be effected very simply and rapidly. It is obvious that the same applies in the case of damage to a feed-through element.

Very advantageously, the feed-through element that is detachably fixed is fixed using a means formed by a part that is fitted in the partition wall thereby forming a seal and that has a bore through which the tubular casing is led, by one or more sealing rings that fit closely to the outer surface of the tubular casing and the part with a bore as well as by a set for the deformation through compression of the sealing rings(s) that acts together with said part with a bore.

Through the fact that the tubular casing takes a fixed stationary position with respect to the above fixing means an excellent sealing is obtained between the exterior of the tubular casing and the part with a bore fitted in the partition wall, whilst said sealing can have a very long life in the case of judicious use.

The invention also relates to an apparatus for the treatment in vacuum of material with wire character, the material to be treated being continuously fed through the apparatus and the apparatus at least consisting of one or more chambers, means for feeding the material through, means for generating a vacuum and feed-through elements characterised in that at least part of the feed-through elements is formed by the feed-through element according to the invention described hereinbefore.

The feed-through element according to the invention will hereinafter be described in more detail with reference to the drawing, wherein:

BRIEF DESCRIPTION OF THE DRAWING

FIG. 1 represents a schematic section through an apparatus that is provided with feed-through elements according to the invention.

FIG. 2 gives a representation of a fixing means for fixing a feed-through element according to the invention in a partition wall so that it can be detached.

FIG. 3 represents a rough sketch of a test arrangement for testing one or more feed-through elements according to the invention.

DETAILED DESCRIPTION OF THE PREFERRED EMBODIMENTS

In FIG. 1, an apparatus for the treatment in vacuum of a wire-shaped material is indicated with chambers 1 up to and including 5. The wire-shaped material enters the apparatus at 6 and leaves it at 12. Furthermore, vacuum means such as so-called roots pumps, oil diffusion pumps or turbomolecular pumps are present with numbers 7 up to and including 11. Feed-through elements 14 up to and including 17 are present in the walls separating the chambers; the track followed by the wire-shaped material to be treated is schematically indicated with 13.

In particular, the feed-through elements indicated with numbers 6 and 12 are formed by the feed-through elements according to the invention; it has been found that the feed-through elements 14 up to and including 17 may also consist of feed-through elements according to the invention; this is not strictly necessary, however, because it has been found that with the vacuum condition prevailing in the whole of the apparatus, the criteria applying to the feed-through element according to the invention may be applied less stringently as in that case the gas flow between the chambers is obviously situated on a much lower level.

In particular, a smaller length of the tubular casing will do for the feed-through elements 14 up to and including 17.

In FIG. 2 is indicated how a tubular casing is fixed in a partition wall of the apparatus, for instance an external wall, so that it can be detached. The tubular casing 21 is located inside the bore of the part 24 that is fixed in the wall 22 thereby forming a seal. 23 schematically indicates that the part 24 is fixed in the wall 22 so that, in principle, it can be exchanged, allowing another part 24 to be fixed in the event that for instance a pipe 21 with a diameter larger than the diameter represented herein is to be introduced. Part 24 acts together with set 25 and 26 by which means a ring 27 can be compressed so that it is deformed to seal against the outer side of pipe 21 and the inner side of bored part 24. Part 25 acts together with part 24 by means of a thread.

In FIG. 3 a test arrangement for testing one or more feed-through elements according to the invention is schematically indicated. A chamber 30 is provided with feed-through elements 31 and 32 fitted in the exterior walls of chamber 30. 33 indicates a connection for a vacuum pump while 34 represents a vacuum measuring apparatus. By way of example of the working of such a test arrangement and of the effectiveness of the feed-through elements according to the invention, reference is made to table I which gives a number of practical values.

An explanation of the term "free surface" can be ascertained from the information in Table 1. As can be seen in the tabulated examples, a pipe with an inside diameter of 1.395 mm is used as the tubular casing through which the wire-like material is passed. A cross-section of the pipe would have an area, according to the area equation for circular cross-sections:

$$\frac{\pi d^2}{4} \text{ or } \frac{\pi (1.395)^2}{4} \text{ or } 1.529 \text{ mm}^2.$$

The outside diameter of the wire-like materials in the Table I example are: 1.18 mm, 1.30 mm and 1.30 mm, respectively. The free surface, that is "S-free", given in the Table is calculated as the cross-sectional area also by the formula $$\frac{\pi d^2}{4}.$$

For "rope" of 1.18 mm diameter, the cross-sectional area is 1.094 mm$^2$ and the cross-sectional area for rope and wire of 1.30 mm diameter is 1.327 mm$^2$. The "free surface", S-free, is shown in Table 1 examples as the difference between the cross-sectional area of the pipe, 1.529 mm$^2$, and the cross-sectional area of the rope and wire, viz. 1.094 mm$^2$ and 1.327 mm$^2$, respectively. This difference is the free surface shown in the Table 1 examples, i.e., 0.43 mm$^2$ and 0.20 mm$^2$, respectively.

Also, given with the examples in Table 1 is the free surface in percent, i.e., 28% and 13% which is the free surface divided by the cross-sectioal area of the pipe. That is $$\frac{0.43 \text{ mm}^2}{1.529 \text{ mm}^2} = 28\% \text{ and } \frac{0.20 \text{ mm}^2}{1.529 \text{ mm}^2} = 13\%.$$

The vertical columns in Table 1 indicate the "L/S" ratios for different pipe lengths and the pressure results obtained in each case.

The first row of the table clearly shows that in the case of a rope with an actual diameter of 1.18 mm that is led through a pipe with a diameter of 1.395 mm and with a pipe length of 300 mm, a situation has been reached that is such that the vacuum obtained no longer or hardly improves when elongating the pipe. The second and third row of the table clearly show that if two wire-shaped materials are fed through, both materials having the same actual outside diameter, the one material being formed by a composite rope and the other material by a smooth wire, the vacuum obtained in the case of the rope is somewhat inferior to that obtained in the case of the smooth wire. This is understandable given the fact that the rope presents space between the individual windings that is not expressed in the value of the actual diameter.

TABLE 1

| | Pressure with pipe (L = 10 cm) in Pa | Pressure with pipe (L = 20 cm) in Pa | Pressure with pipe (L = 30 cm) in Pa | Pressure with pipe (L = 40 cm) in Pa | Pressure with pipe (L = 50 cm) in Pa |
|---|---|---|---|---|---|
| Pipe dia. = 1.395 mm; Pumping speed: 420 m³/h (roots pump); Wire transport speed of material: 20–30 m/min | | | | | |
| Rope 3 + (9 × 0.22) + 1 ($\phi$ = 1.18 mm) free surf. = 0.43 mm² = 28% | $L/S = 232$ mm$^{-1}$; $9 \times 10^{+1}$ Pa | $L/S = 464$ mm$^{-1}$; $6.5 \times 10^{+1}$ Pa | $L/S = 696$ mm$^{-1}$; $5 \times 10^{+1}$ Pa | $L/S = 928$ mm$^{-1}$; $4 \times 10^{+1}$ Pa | $L/S = 1150$ mm$^{-1}$; $5 \times 10^{+1}$ Pa |
| Rope 3 + 9 + (15 × 0.22) ($\phi$ = 1.30 mm) free surf. = 0.20 mm² = 13% | $L/S = 500$ mm$^{-1}$; $1.3 \times 10^{+1}$ Pa | $L/S = 1000$ mm$^{-1}$; 8 Pa | $L/S = 1500$ mm$^{-1}$; 5.5 Pa | $L/S = 2000$ mm$^{-1}$; 4 Pa | $L/S = 2500$ mm$^{-1}$; 4 Pa |
| Smooth Wire ($\phi$ = 1.30 mm free surf. = 0.20 mm² = 13% | $L/S = 500$ mm$^{-1}$ | $L/S = 1000$ mm$^{-1}$ | $L/S = 1500$ mm$^{-1}$ | $L/S = 2000$ mm$^{-1}$ | $L/S = 2500$ mm$^{-1}$ |
| No Wire nor rope | $L/S < 500$ mm$^{-1}$; $4.5 \times 10^2$ Pa | $L/S < 500$ mm$^{-1}$; $3 \times 10^2$ Pa | $L/S < 500$ mm$^{-1}$; $3 \times 10^2$ Pa | $L/S < 500$ mm$^{-1}$; $2.5 \times 10^2$ Pa | $L/S < 500$ mm$^{-1}$; $2.5 \times 10^2$ Pa |

What is claimed is:

1. A feed-through element for application in a vacuum apparatus for the continuous feeding therethrough of material with wire character to be treated therein comprising a tubular casing with an inside diameter that is larger than the outside diameter of the material to be fed therethrough, the inside diameter and length of the tubular casing being determined and selected by reference to the diameter of said wire material according to the following relationship: the ratio of free surface (S-free), to the inside cross-sectional area of the tubular casing does not exceed 30% and the ratio of the length of the tubular casing (L) to the free surface (L/S-free) is at least 500 mm$^{-1}$; and wherein said free surface is the difference between the cross-sectional areas of said tubular casing and said wire material.

2. A feed-through element according to claim 1, characterised in that the ratio of free surface to the inside cross-sectional area of the tubular casing is less than 15%, the length of the tubular casing is at least 200 mm and L/S-free is at least 1000 mm$^{-1}$.

3. Feed-through element according to claim 1, characterised in that said element is detachably fixed in a partition wall.

4. Feed-through element according to claim 3, further comprising detachable sealing means to fix said element in the partition wall, said sealing means having a bore through which the tubular casing is positioned, and at least one compressible sealing ring fit closely to the outer surface of the tubular casing.

5. Apparatus for the treatment in vacuum of material with wire character, the material to be treated being continuously fed through the apparatus and the apparatus comprising at least one chamber having end walls, means for feeding material therethrough, means for generating a vacuum in said chamber, and at least one feed-through element positioned in at least one end wall, said feed-through element comprising a tubular casing with an inside diameter that is larger than the outside diameter of the material to be fed therethrough, the inside diameter and length of the tubular casing being determined and selected by reference to the diameter of said wire material according to the following relationship: the ratio of free surface (S-free), to the inside cross-sectional area of the tubular casing does not exceed 30% and the ratio of the length of the tubular casing (L) to the free surface (L/S-free) is at least 500 mm$^{-1}$; and wherein said free surface is the difference between the cross-sectional areas of said tubular casing and said wire material.

* * * * *

UNITED STATES PATENT AND TRADEMARK OFFICE
CERTIFICATE OF CORRECTION

PATENT NO. : 4,811,583
DATED : March 14, 1989
INVENTOR(S) : Hugo LIEVENS et al

It is certified that error appears in the above-identified patent and that said Letters Patent is hereby corrected as shown below:

IN THE TITLE

The title on the front of the patent and also on column 1, should be "VACUUM APPARATUS AND FEED-THROUGH ELEMENTS THEREFOR"

Columns 5 and 6, or Table 1, for the line "Smooth Wire" insert the results for the pressures as follows:
-- $1 \times 10^{+1}$ Pa ; 7.2 Pa ; 5 Pa ; 3 Pa ; 3 Pa --.

Signed and Sealed this

Fourteenth Day of November, 1989

Attest:

JEFFREY M. SAMUELS

Attesting Officer     Acting Commissioner of Patents and Trademarks